(12) United States Patent
Wu et al.

(10) Patent No.: US 10,147,148 B2
(45) Date of Patent: Dec. 4, 2018

(54) DISTRIBUTED ENERGY POWER SOURCE CONTROL METHOD, APPARATUS AND SYSTEM FOR PROVIDING LOADS WITH DYNAMIC POWER DISTRIBUTION MODES

(71) Applicant: GREE ELECTRIC APPLIANCES, INC. OF ZHUHAI, Zhuhai, Guangdong (CN)

(72) Inventors: Chao Wu, Zhuhai (CN); Mingyao Xi, Zhuhai (CN); Zhiwei Zheng, Zhuhai (CN)

(73) Assignee: GREE ELECTRIC APPLIANCES INC. OF ZHUHAI, Zhuhai, Guangdong (CN)

( * ) Notice: Subject to any disclaimer, the term of this patent is extended or adjusted under 35 U.S.C. 154(b) by 57 days.

(21) Appl. No.: 15/506,297

(22) PCT Filed: Aug. 21, 2015

(86) PCT No.: PCT/CN2015/087846
§ 371 (c)(1),
(2) Date: Feb. 24, 2017

(87) PCT Pub. No.: WO2016/029825
PCT Pub. Date: Mar. 3, 2016

(65) Prior Publication Data
US 2017/0278199 A1   Sep. 28, 2017

(30) Foreign Application Priority Data
Aug. 26, 2014  (CN) .......................... 2014 1 0425614

(51) Int. Cl.
*G06Q 50/06*   (2012.01)
*H01M 10/42*   (2006.01)
(Continued)

(52) U.S. Cl.
CPC ............. *G06Q 50/06* (2013.01); *G06Q 10/06* (2013.01); *H01L 31/053* (2014.12);
(Continued)

(58) Field of Classification Search
CPC ...... G06Q 10/06; G06Q 50/06; H01L 31/053; H01M 10/425; H02H 7/12; H02J 3/383;
(Continued)

(56) References Cited

U.S. PATENT DOCUMENTS 5,381,554 A * 1/1995 Langer ...................... G06F 1/26
                                                                 307/38
7,337,336 B2 * 2/2008 Ferentz ..................... G06F 1/30
                                                                 713/300
(Continued)

FOREIGN PATENT DOCUMENTS

CN   102144344 A   8/2011
CN   102483643 A   5/2012
(Continued)

OTHER PUBLICATIONS

European Patent Office, European search reported dated Sep. 8, 2017.
Australia Patent Office, Examination report dated Aug. 17, 2018.

*Primary Examiner* — Chun Cao
(74) *Attorney, Agent, or Firm* — Li & Cai Intellectual Property (USA) Office (57) ABSTRACT

A distributed energy power source control method, apparatus and system are provided. The method includes the following steps. The total amount of energy provided by an energy supply apparatus for various loads in a system is read. Energy data of each load is collected, the energy data including: a power supply voltage, a power supply current, a reactive power, an active power, and power consumption. The total power consumption of all the loads in the system is calculated. An energy allocation policy is determined by (Continued)

comparing the total power consumption and the total amount of energy, the energy allocation policy including: allocating energy according to a priority level of each load, and switching energy modes according to a power factor of each load. The method, apparatus and system can provide loads with dynamic power distribution modes, thereby improving the working efficiency, reliability and stability of an entire power supply system.

11 Claims, 3 Drawing Sheets

(51) Int. Cl.
  *H02J 3/46* (2006.01)
  *H01L 31/053* (2014.01)
  *G06Q 10/06* (2012.01)
  *H02H 7/12* (2006.01)
  *H02J 3/38* (2006.01)
  *H02J 7/00* (2006.01)
  *H02J 3/14* (2006.01)
  *H02J 3/18* (2006.01)
  *H02J 3/32* (2006.01)

(52) U.S. Cl.
  CPC ............ *H01M 10/425* (2013.01); *H02H 7/12* (2013.01); *H02J 3/14* (2013.01); *H02J 3/18* (2013.01); *H02J 3/383* (2013.01); *H02J 3/46* (2013.01); *H02J 7/007* (2013.01); *H02J 3/32* (2013.01); *Y02B 70/3225* (2013.01); *Y02E 10/763* (2013.01); *Y02E 40/30* (2013.01); *Y04S 20/222* (2013.01)

(58) Field of Classification Search
  CPC ...... H02J 7/007; H02J 3/14; H02J 3/18; H02J 3/386; H02J 3/46

USPC .................................................. 700/22, 286
  See application file for complete search history.

(56) References Cited

U.S. PATENT DOCUMENTS

| | | | | |
|---|---|---|---|---|
| 7,340,620 | B2 * | 3/2008 | Dove | G06F 1/266 |
| | | | | 713/300 |
| 7,865,754 | B2 * | 1/2011 | Burkland | H04L 12/10 |
| | | | | 326/9 |
| 8,001,397 | B2 * | 8/2011 | Hansalia | H04L 12/10 |
| | | | | 713/300 |
| 9,678,563 | B2 * | 6/2017 | Hamdi | G06F 1/3296 |
| 2001/0010032 | A1 * | 7/2001 | Ehlers | G05B 15/02 |
| | | | | 702/62 |
| 2004/0230846 | A1 * | 11/2004 | Mancey | H04L 12/10 |
| | | | | 713/300 |
| 2009/0138734 | A1 * | 5/2009 | Uchida | G06F 1/266 |
| | | | | 713/310 |
| 2011/0153108 | A1 * | 6/2011 | Yoon | G06Q 50/06 |
| | | | | 700/295 |
| 2014/0018969 | A1 | 1/2014 | Forbes, Jr. | |
| 2015/0025702 | A1 * | 1/2015 | Kang | G01R 21/1331 |
| | | | | 700/297 |

FOREIGN PATENT DOCUMENTS

| | | |
|---|---|---|
| CN | 202586493 U | 12/2012 |
| CN | 204333982 U | 5/2015 |
| EP | 2535997 A2 | 12/2012 |
| EP | 2744070 A1 | 6/2014 |
| WO | WO 2008/039759 A2 | 4/2008 |

* cited by examiner

DISTRIBUTED ENERGY POWER SOURCE CONTROL METHOD, APPARATUS AND SYSTEM FOR PROVIDING LOADS WITH DYNAMIC POWER DISTRIBUTION MODES

FIELD

The disclosure relates to the field of electrics, more particularly to a distributed energy power source control method, apparatus and system.

BACKGROUND

All components (e.g., power supply, power distribution and load) of a traditional AC power distribution system are closely related. The working mode of close contact on dynamic characteristics will cause that an entire power supply system is very huge. In the huge power system, as long as all dynamic changes are slow enough, the reliability of control and the stability of the system can be ensured. So, it is difficult to quickly respond to an emergency in a power grid. Therefore, the control speed is low, and the reliability and the stability are not high.

An effective solution has not been proposed yet currently for the problems of low working efficiency and poor stability of a power supply system caused by the fact that the power supply system cannot provide a dynamic power distribution mode in the related art.

SUMMARY

An effective solution has not been proposed yet currently for the problems of low working efficiency and poor stability of a power supply system caused by the fact that the power supply system cannot provide a dynamic power distribution mode in the related art. Thus, the invention mainly aims to provide a distributed energy power source control method, apparatus and system, used for solving the above-mentioned problems.

To this end, according to an aspect of the invention, a distributed energy power source control method is provided. The method may include that: the total amount of energy provided by an energy supply apparatus for various loads in a system is read; energy data of each load is collected, the energy data including: a power supply voltage, a power supply current, a reactive power, an active power, and power consumption; the total power consumption of all the loads in the system is calculated; and an energy allocation policy is determined by comparing the total power consumption and the total amount of energy, the energy allocation policy including: allocating energy according to a priority level of each load, and switching energy modes according to a power factor of each load.

To this end, according to another aspect of the invention, a distributed energy power source control apparatus is provided. The apparatus may include: a reading module, configured to read the total amount of energy provided by an energy supply apparatus for various loads in a system; a collection module, configured to collect energy data of each load, the energy data including: a power supply voltage, a power supply current, a reactive power, an active power, and power consumption; a calculation module, configured to calculate the total power consumption of all the loads in the system; and a processing module, configured to determine an energy allocation policy by comparing the total power consumption and the total amount of energy, the energy allocation policy including: allocating energy according to a priority level of each load, and switching energy modes according to a power factor of each load.

To this end, according to a further aspect of the invention, a distributed energy power source control system is provided. The system may include: an energy supply apparatus, configured to provide energy for each load in the system; a detection and measurement apparatus, communicating with a detection apparatus on each load, collecting energy data of each load, detected by the detection apparatus, and calculating the total power consumption of all the loads in the system, wherein the energy data includes: a power supply voltage, a power supply current, a reactive power, an active power, and power consumption; and an energy control apparatus, connected to the detection and measurement apparatus, and configured to determine an energy allocation policy by comparing the total power consumption and the total amount of energy, the energy allocation policy including: allocating energy according to a priority level of each load, and switching energy modes according to a power factor of each load.

By means of the invention, the total amount of energy provided by an energy supply apparatus for various loads in a system is read; energy data of each load is collected, the energy data including: a power supply voltage, a power supply current, a reactive power, an active power, and power consumption; the total power consumption of all the loads in the system is calculated; and an energy allocation policy is determined by comparing the total power consumption and the total amount of energy, the energy allocation policy including: allocating energy according to a priority level of each load, and switching energy modes according to a power factor of each load. The problems of low working efficiency and poor stability of a power supply system caused by the fact that the power supply system cannot provide a dynamic power distribution mode are solved, thereby achieving the effects of providing loads with dynamic power distribution modes and improving the working efficiency, reliability and stability of an entire power supply system.

BRIEF DESCRIPTION OF THE DRAWINGS

The drawings illustrated herein are intended to provide further understanding of the disclosure, and form a part of the disclosure. The schematic embodiments and illustrations of the disclosure are intended to explain the disclosure, and do not form improper limits to the disclosure. In the drawings.

DETAILED DESCRIPTION OF THE EMBODIMENTS

It is important to note that the embodiments in the disclosure and the characteristics in the embodiments may be combined under the condition of no conflicts. The disclosure will be described below with reference to the drawings and in combination with the embodiments in detail.

In order to make those skilled in the art better understand the solutions of the disclosure, the technical solutions in the embodiments of the disclosure are clearly and completely described below with reference to the drawings in the embodiments of the disclosure. Obviously, the described embodiments are only a part of the embodiments of the disclosure, not all of the embodiments. On the basis of the embodiments in the disclosure, all other embodiments obtained under the premise of no creative work of those skilled in the art fall within the scope of protection of the disclosure.

It is important to note that the specification and claims of the disclosure and terms 'first', 'second' and the like in the above-mentioned drawings are used to distinguish similar objects, and do not need to describe a specific sequence or a precedence order. It will be appreciated that data used in such a way may be exchanged under appropriate conditions, in order that the embodiments of the disclosure described herein can be implemented in a sequence other than sequences graphically shown or described here. In addition, terms 'include' and 'have' and any inflexions thereof are intended to cover non-exclusive inclusions. For instance, it is not limited for processes, methods, systems, products or devices containing a series of steps or units to clearly list those steps or units, and other steps or units which are not clearly listed or are inherent to these processes, methods, products or devices may be included instead.

Embodiment 1

Figure 1:
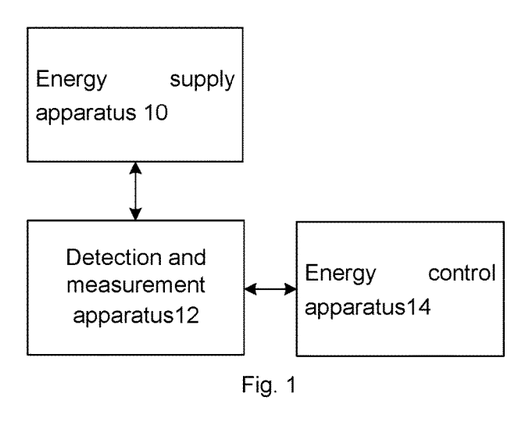
FIG. 1 is a structure diagram of a distributed energy power source control system according to an embodiment 1 of the disclosure.

In the most basic configuration, FIG. 1 is a structure diagram of a distributed energy power source control system according to an embodiment 1 of the disclosure. As shown in FIG. 1, the distributed energy power source control system may include: an energy supply apparatus 10, a detection and measurement apparatus 12, and an energy control apparatus 14.

Wherein, the energy supply apparatus 10 is configured to provide energy for each load in the system; the detection and measurement apparatus 12 communicates with a detection apparatus on each load, collects energy data of each load, detected by the detection apparatus, and calculates the total power consumption of all the loads in the system, wherein the energy data may include: a power supply voltage, a power supply current, a reactive power, an active power, and power consumption; and the energy control apparatus 14 is connected to the detection and measurement apparatus 12, and is configured to determine an energy allocation policy by comparing the total power consumption and the total amount of energy, the energy allocation policy including: allocating energy according to a priority level of each load, and switching energy modes according to a power factor of each load.

According to the solution provided by the above-mentioned embodiment 1 of the disclosure, the detection and measurement apparatus 12 collects the energy data of each load in the system to determine electric energy demand data of each load, and after the energy control apparatus 14 compares the total power consumption of the loads and the total amount of energy provided by the energy supply apparatus of the system, a current energy allocation policy may be determined. In the above-mentioned process, large data analysis comparison is performed for a current electric energy demand of each load, so an optimal electric energy allocation mode is determined to run, and the problems of low working efficiency and poor stability of a power supply system caused by the fact that the power supply system cannot provide a dynamic power distribution mode are solved, thereby achieving the effects of providing loads with dynamic power distribution modes and improving the working efficiency, reliability and stability of an entire power supply system, so as to ensure that the system works efficiently, safely and reliably.

Preferably, the energy supply apparatus in the above-mentioned embodiment of the disclosure may include any one or more of the following devices: a renewable energy device connected to the energy control apparatus, a power grid power supply device, and a storage battery. Here, it is important to note that in the entire system, the renewable energy device such as a photovoltaic device and the power grid power supply device serves as a main supply of load energy, and the storage battery serves as a matched power source.

Figure 2:
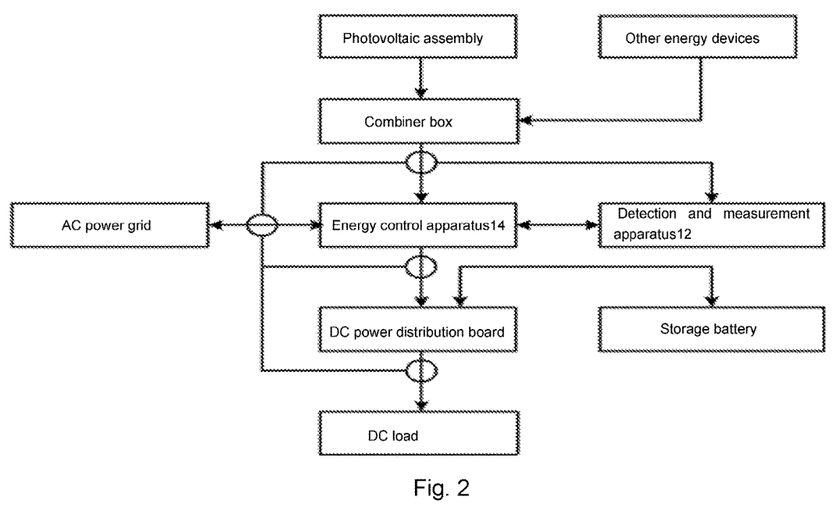
FIG. 2 is a detailed structure diagram of an optional distributed energy power source control system according to an embodiment 1 of the disclosure.

Referring to FIG. 2, it may be seen that the energy supply apparatus 10 for providing renewable energy may include a photovoltaic assembly and other energy devices. Preferably, a combiner box may be mounted between the energy supply apparatus 10 and the energy control apparatus 14, and is configured to combine the renewable energy provided by the photovoltaic assembly and the other energy devices together and then to allocate the renewable energy for the energy control apparatus 14. The above-mentioned storage battery is an energy storage module, and under the condition of shortage of the renewable energy provided by the renewable energy device and disconnection of commercial power provided by the power grid power supply device, the storage battery starts to provide electric energy for loads. In a preferred embodiment, the storage battery may supply power to the load having the highest priority preferentially, thereby ensuring normal working of an important load.

Wherein, the detection and measurement apparatus 12 may collect energy data returned by each load module, measure the collected energy data, and feed the data back to the energy control apparatus 14 finally for unified management. The energy control apparatus 14 determines a reasonable energy allocation policy by analyzing the returned energy data of each load, the energy allocation policy being an energy optimization solution.

Here, it is also important to note that the above-mentioned power supply device may be an AC power grid. In case of shortage of the renewable energy provided by the energy supply apparatus 10, power may be supplied by using the AC power grid by switching. In case of sufficient power supplied by grid-connected operation, the storage battery is in a fully charged state. In case of power failure or shortage of power supplied by grid-connected operation, the storage battery discharges electricity for use, and the storage battery serves as a standby power source. In case of no power supply of main energy and the AC power grid, a running demand of the entire system is maintained. When the energy supply amount is lower than 30% of the total load capacity, power is supplied to a primary load preferentially, and power may be supplied to some secondary loads optionally.

Preferably, referring to FIG. 2, it may be seen that the system in the above-mentioned embodiment of the disclosure may further include: a DC power distribution board, connected between the energy control apparatus 10 and each DC load, and configured to generate an energy allocation instruction of each load according to the energy allocation policy. Specifically, the DC power distribution board may have an energy allocation function for the DC loads, such that the energy supply apparatus 10 generates an energy allocation command after determining the energy allocation policy. In a more preferred embodiment, the energy allocation command may complete a function of allocating energy for the loads according to the priority, and may make a quick response when an energy management system judges a fault point and gives a cut-off command.

In the above-mentioned embodiment of the disclosure, the energy control apparatus 14 may include: a first processor 141 or a second processor 143.

In an optional solution provided by the disclosure, the energy control apparatus 14 may be the first processor 141, the first processor 141 being configured to judge whether a ratio of the total power consumption to the total amount of energy is smaller than or equal to a predetermined value, wherein if the ratio of the total power consumption to the total amount of energy is smaller than or equal to the predetermined value, energy is allocated according to the priority of each load selectively, and if the ratio of the total power consumption to the total amount of energy is greater than the predetermined value, energy modes are switched according to a power factor of each load selectively.

In an optional solution provided by the disclosure, the energy control apparatus 14 may be the second processor 143, the second processor 143 being configured to judge whether the total power consumption is greater than or equal to the total amount of energy, wherein when the total power consumption is greater than or equal to the total amount of energy, energy is allocated according to the priority of each load selectively, and when the total power consumption is smaller than the total amount of energy, energy modes are switched according to a power factor of each load selectively.

Preferably, in the first optional solution provided by the disclosure, the above-mentioned solution of allocating energy according to the priority of each load may be implemented by means of the following steps. Firstly, the priority of each load is read. Then, energy is allocated for a predetermined number of loads in sequence according to a priority order.

Specifically, the above-mentioned total power consumption may refer to the total load capacity of all the loads, the total amount of energy may refer to the power generation amount. Thus, a feasible solution of judging whether the ratio of the total power consumption to the total amount of energy is smaller than or equal to the predetermined value is used for verifying whether the power generation amount is lower than 30% of the total load capacity.

The priority of each load may be preset in the disclosure, and the loads may be divided according to the classes of the loads, including: primary loads (important loads, e.g., hospital surgical equipment and data service terminals), secondary loads (common loads, e.g., lights), and multi-stage loads. After the priorities of all the loads are determined, energy is allocated according to the priority order. That is, energy is allocated for the primary loads preferentially, thereby realizing reasonable allocation of energy according to the classes of the loads.

Thus, the above-mentioned embodiment of the disclosure achieves that in case of shortage of energy supplied in the system, the energy management system will allocate energy according to the priority, and the load having a high priority gains energy preferentially. That is, after energy data (power consumption and energy consumption) between various loads in a DC system is collected in real time, in case of shortage of energy (the power generation amount is lower than 30% of the total load capacity), energy allocation of the entire system is reasonably optimized as demanded, thereby achieving the effect of energy optimization (the priority has been set when delivery, but a user may self-change the settings via the specification).

For example, when the system is applied to a hospital, the primary loads may be operating tables, monitoring systems, emergency lights and the like, and when the power generation amount is lower than 30% of the total load capacity, the allocation principle must be satisfied, energy is supplied to the primary load having the highest priority preferentially, and an energy early-warning signal is given.

Preferably, in the second optional solution provided by the disclosure, the above-mentioned solution of allocating energy according to the priority of each load may be implemented by means of the following steps. The power factor of each load is compared with a corresponding predetermined power factor. When the power factor of any one or more loads is smaller than or equal to the corresponding predetermined power factor, a power compensation apparatus is started to adjust a power factor of the system.

According to the above-mentioned solution of the disclosure, the power factors of various loads are compared and analyzed. If a branch power factor of a certain load is low (the power factor of each load may be smaller than or equal to the predetermined power factor, wherein the predetermined power factor may range from 0.85 to 0.95, and preferably, the predetermined power factor may be 0.9), a service terminal of the system will automatically starts the power compensation apparatus corresponding to the load, so the power factor of the entire system is maximized (i.e., the power factor may be greater than 0.9). At this time, the system is switched to an optimal working mode.

Thus, the above-mentioned embodiment achieves collection and analytic comparison of energy of each load, and optimal energy modes are switched as required.

Here, it is important to note that the power factor is important technical data of a power system, and the power factor is a coefficient for measuring the efficiency of an electrical device. If the power factor is low, it is shown that the reactive power for alternating magnetic field conversion of a circuit is high, thereby reducing the utilization rate of the device, and increasing line power supply losses. In an AC circuit, the cosine of a phase difference ($\phi$) between voltage and current is called as the power factor which is represented by a symbol cos $\phi$. In terms of numerical values, the power factor is a ratio of an active power to an apparent power, i.e., cos $\phi$=P/S. Since the power factor represents the proportion of the active power to the total power, the power factor will not be greater than 1 in any case obviously. From a power triangle, it may be seen that when $\phi$=0°, i.e., voltage and current are in-phase in the AC circuit, the active power is equal to the apparent power. In this case, the value of cos $\phi$ is maximum, i.e., cos $\phi$=1. When there is only a purely resistive load in the circuit or inductive reactance is equal to capacitive reactance in the circuit, this situation will occur.

The detection and measurement apparatus 12 in the above-mentioned embodiment of the disclosure is in wireless connection with the detection apparatus on each load, and the energy control apparatus is in wired connection with the detection and measurement apparatus, wherein the wireless connection at least includes any one of the following forms: GPRS, 3G, WIFI, and Bluetooth.

Specifically, by means of the energy control apparatus 14 as shown in FIG. 2 of the disclosure, it may be implemented that energy provided by the energy supply apparatus 10 is reasonably allocated according to real-time energy data collected by the detection and measurement apparatus 12, and in this process, the detection and measurement apparatus 12 may adopt co-existence management control modes including wireless control and wired control, wherein the energy control apparatus 14 and the detection and measurement apparatus 12 may adopt the wired control. Since the amount of data interacted between the energy control apparatus 14 and the detection and measurement apparatus 12 is larger, transmission lag will be generated by adopting the wireless control, and it may be ensured that data is efficiently interacted in real time by adopting wired transmission. Remote data transmission is performed between the detection apparatus (e.g., electric energy detection meter) of each DC load and the detection and measurement apparatus 12, in order to improve the transmission speed therebetween. Therefore, wireless control may be adopted between the detection apparatus (e.g., electric energy detection meter) of each DC load and the detection and measurement apparatus 12.

It can thus be seen that in a process of collecting, analyzing and comparing the energy usage situation of each load by the entire energy management system via the energy control apparatus 14, main parameters of used electric energy need to be monitored and regulated in real time, so in order to ensure the high efficiency and reliability of power, the system takes a wireless detection control way, a central control room performs unified management and control on the detection and measurement apparatus 12 and the detection and measurement apparatus 12, the energy usage situation of each module may be quickly, efficiently and accurately collected, analyzed and compared, and optimal energy modes are switched as required.

Preferably, in the solution provided by the above-mentioned embodiment of the disclosure, after the detection and measurement apparatus 12 collects the energy data of each load, the following functions may also be achieved. Fault information is acquired by monitoring the energy data of each load in real time, and after a faulty load is determined according to the fault information, it is necessary to cut the faulty load off and to give fault alarm information.

In the above-mentioned embodiment of the disclosure, a fault loop of the system is monitored on line by monitoring the energy data of each load in real time. Specifically, the collected current voltage data may be compared and analyzed, an abnormal area is locked, and the faulty load is determined by taking conventional fault elimination measures. For example, the abnormal area is cut off within a short time, data is collected and analyzed within this period of time to judge whether the fault is eliminated, if the fault is eliminated, a fault area may be locked, and a maintainer is informed of elimination.

It can thus be seen that the disclosure provides a solution (preferably, wired manner) for quickly cutting a fault point off by monitoring the electric energy parameter situation (voltage, current, reactive power, active power, and power consumption) of each load in real time when a load has an abnormal fault, and the gathered fault data is sent by a communication unit in the energy control apparatus 14 to inform related personnel of maintenance, thereby achieving intelligent management.

Herein, it is important to note that when the fault information of a load is detected, automatic analysis comparison is needed, the load having the fault information is quickly cut off, and after the fault point is cut off, the electric energy data of the load is collected and analyzed to confirm that the fault has been eliminated, thereby ensuring safe, reliable and efficient power of the entire system.

Embodiment 2

Figure 3:
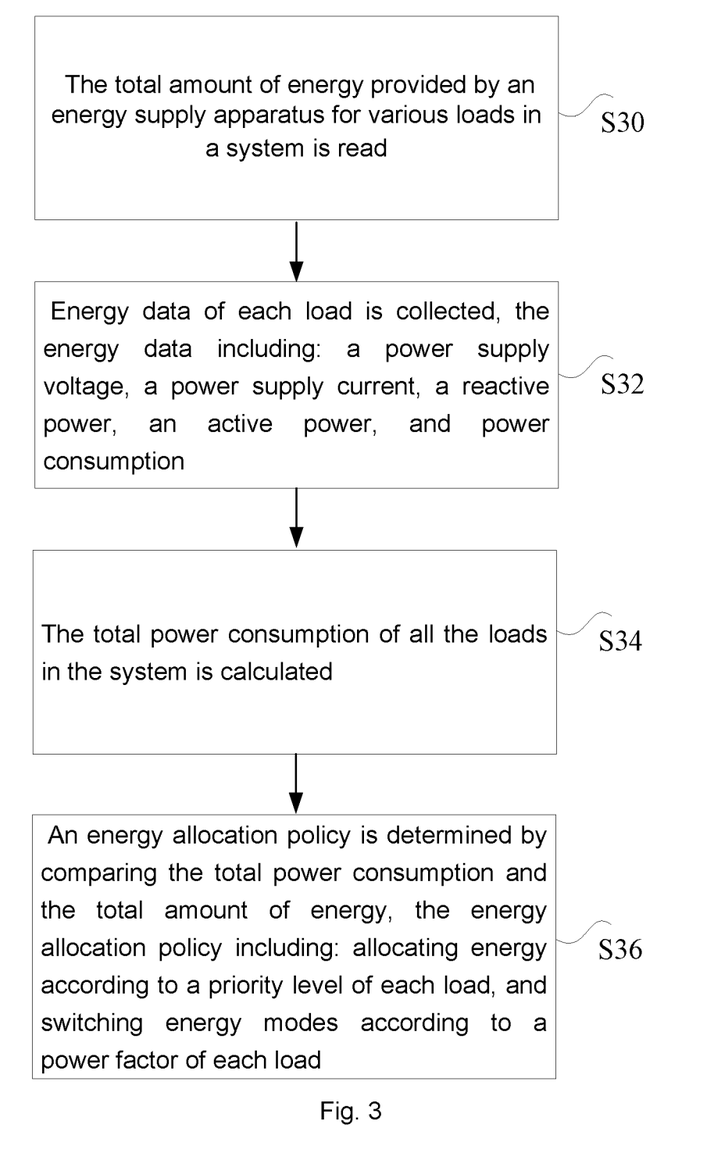
FIG. 3 is a flowchart of a distributed energy power source control method according to an embodiment 2 of the disclosure.

FIG. 3 is a flowchart of a distributed energy power source control method according to an embodiment 2 of the disclosure. As shown in FIG. 3, the method includes the following steps.

Step S30: The total amount of energy provided by an energy supply apparatus for various loads in a system may be read by means of an energy control apparatus 14 as shown in FIG. 1.

Step S32: Energy data of each load acquired by a detection and measurement apparatus 12 may be collected by means of the energy control apparatus 14 as shown in FIG. 1, the energy data including: a power supply voltage, a power supply current, a reactive power, an active power, and power consumption.

Step S34: The total power consumption of all the loads in the system may be calculated by means of the energy control apparatus 14 as shown in FIG. 1.

Step S36: An energy allocation policy may be determined by comparing the total power consumption and the total amount of energy by means of the energy control apparatus 14 as shown in FIG. 1, the energy allocation policy including: allocating energy according to a priority level of each load, and switching energy modes according to a power factor of each load.

According to the solution provided by the above-mentioned embodiment 2 of the disclosure, electric energy demand data of each load is determined by collecting the energy data of each load in the system, and after the total power consumption of the loads and the total amount of energy provided by the energy supply apparatus of the system are compared, a current energy allocation policy may be determined. In the above-mentioned process, large data analysis comparison is performed for a current electric energy demand of each load, so an optimal electric energy allocation mode is determined to run, and the problems of low working efficiency and poor stability of a power supply system caused by the fact that the power supply system cannot provide a dynamic power distribution mode are solved, thereby achieving the effects of providing loads with dynamic power distribution modes and improving the working efficiency, reliability and stability of an entire power supply system, so as to ensure that the system works efficiently, safely and reliably.

Preferably, the energy supply apparatus in the above-mentioned embodiment of the disclosure may include any one or more of the following devices: a renewable energy device connected to the energy control apparatus, a power grid power supply device, and a storage battery. Here, it is important to note that in the entire system, the renewable energy device such as a photovoltaic device and the power grid power supply device serves as a main supply of load energy, and the storage battery serves as a matched power source.

Referring to FIG. 2, it may be seen that the energy supply apparatus 10 for providing renewable energy may include a photovoltaic assembly and other energy devices. Preferably, a combiner box may be mounted between the energy supply apparatus 10 and the energy control apparatus 14, and is configured to combine the renewable energy provided by the photovoltaic assembly and the other energy devices together and then to allocate the renewable energy for the energy control apparatus 14. The above-mentioned storage battery is an energy storage module, and under the condition of shortage of the renewable energy provided by the renewable energy device and disconnection of commercial power provided by the power grid power supply device, the storage battery starts to provide electric energy for loads. In a preferred embodiment, the storage battery may supply power to the load having the highest priority preferentially, thereby ensuring normal working of an important load.

Wherein, the detection and measurement apparatus 12 may collect energy data returned by each load module, measure the collected energy data, and feed the data back to the energy control apparatus 14 finally for unified management. The energy control apparatus 14 determines a reasonable energy allocation policy by analyzing the returned energy data of each load, the energy allocation policy being an energy optimization solution.

Here, it is also important to note that the above-mentioned power supply device may be an AC power grid. In case of shortage of the renewable energy provided by the energy supply apparatus 10, power may be supplied by using the AC power grid by switching. In case of sufficient power supplied by grid-connected operation, the storage battery is in a fully charged state. In case of power failure or shortage of power supplied by grid-connected operation, the storage battery discharges electricity for use, and the storage battery serves as a standby power source. In case of no power supply of main energy and the AC power grid, a running demand of the entire system is maintained. When the energy supply amount is lower than 30% of the total load capacity, power is supplied to a primary load preferentially, and power may be supplied to some secondary loads optionally.

Preferably, referring to FIG. 2, it may be seen that the system in the above-mentioned embodiment of the disclosure may further include: a DC power distribution board, connected between the energy control apparatus 10 and each DC load, and configured to generate an energy allocation instruction of each load according to the energy allocation policy. Specifically, the DC power distribution board may have an energy allocation function for the DC loads, such that the energy supply apparatus 10 generates an energy allocation command after determining the energy allocation policy. In a more preferred embodiment, the energy allocation command may complete a function of allocating energy for the loads according to the priority, and may make a quick response when an energy management system judges a fault point and gives a cut-off command.

Preferably, in the above-mentioned embodiment 1 of the disclosure, Step S36 of determining the energy allocation policy by comparing the total power consumption and the total amount of energy may include any one or more of the following implementation modes:

Mode 1: judging whether a ratio of the total power consumption to the total amount of energy is smaller than or equal to a predetermined value, wherein if the ratio of the total power consumption to the total amount of energy is smaller than or equal to the predetermined value, energy is allocated according to the priority of each load selectively, and if the ratio of the total power consumption to the total amount of energy is greater than the predetermined value, energy modes are switched according to a power factor of each load selectively; and Mode 2: judging whether the total power consumption is greater than or equal to the total amount of energy, wherein when the total power consumption is greater than or equal to the total amount of energy, energy is allocated according to the priority of each load selectively, and when the total power consumption is smaller than the total amount of energy, energy modes are switched according to a power factor of each load selectively.

Preferably, the steps of allocating energy according to the priority of each load, implemented in the above-mentioned modes 1 and 2, may include one of the following implementation solutions: reading the priority of each load is read; and allocating energy for a predetermined number of loads in sequence according to a priority order.

Specifically, the above-mentioned total power consumption may refer to the total load capacity of all the loads, the total amount of energy may refer to the power generation amount. Thus, a feasible solution of judging whether the ratio of the total power consumption to the total amount of energy is smaller than or equal to the predetermined value is used for verifying whether the power generation amount is lower than 30% of the total load capacity.

The priority of each load may be preset in the disclosure, and the loads may be divided according to the classes of the loads, including: primary loads (important loads, e.g., hospital surgical equipment and data service terminals), secondary loads (common loads, e.g., lights), and multi-stage loads. After the priorities of all the loads are determined, energy is allocated according to the priority order. That is, energy is allocated for the primary loads preferentially, thereby realizing reasonable allocation of energy according to the classes of the loads.

Thus, the above-mentioned embodiment of the disclosure achieves that in case of shortage of energy supplied in the system, the energy management system will allocate energy according to the priority, and the load having a high priority gains energy preferentially. That is, after energy data (power consumption and energy consumption) between various loads in a DC system is collected in real time, in case of shortage of energy (the power generation amount is lower than 30% of the total load capacity), energy allocation of the entire system is reasonably optimized as demanded, thereby achieving the effect of energy optimization (the priority has been set when delivery, but a user may self-change the settings via the specification).

For example, when the system is applied to a hospital, the primary loads may be operating tables, monitoring systems, emergency lights and the like, and when the power generation amount is lower than 30% of the total load capacity, the allocation principle must be satisfied, energy is supplied to the primary load having the highest priority preferentially, and an energy early-warning signal is given.

Preferably, the steps of switching energy modes according to the power factor of each load, implemented in the above-mentioned modes 1 and 2, may include one of the following implementation solutions: comparing the power factor of each load and a corresponding predetermined power factor; and when the power factor of any one or more loads is smaller than or equal to the corresponding predetermined power factor, starting a power compensation apparatus to adjust a power factor of the system.

According to the above-mentioned solution of the disclosure, the power factors of various loads are compared and analyzed. If a branch power factor of a certain load is low (the power factor of each load may be smaller than or equal to the predetermined power factor, wherein the predetermined power factor may range from 0.85 to 0.95, and preferably, the predetermined power factor may be 0.9), a service terminal of the system will automatically start the power compensation apparatus corresponding to the load, so the power factor of the entire system is maximized (i.e., the power factor may be greater than 0.9). At this time, the system is switched to an optimal working mode.

Thus, the above-mentioned embodiment achieves collection and analytic comparison of energy of each load, and optimal energy modes are switched as required.

Here, it is important to note that the power factor is important technical data of a power system, and the power factor is a coefficient for measuring the efficiency of an electrical device. If the power factor is low, it is shown that the reactive power for alternating magnetic field conversion of a circuit is high, thereby reducing the utilization rate of the device, and increasing line power supply losses. In an AC circuit, the cosine of a phase difference ($\phi$) between voltage and current is called as the power factor which is represented by a symbol cos $\phi$. In terms of numerical values, the power factor is a ratio of an active power to an apparent power, i.e., cos $\phi$=P/S. Since the power factor represents the proportion of the active power to the total power, the power factor will not be greater than 1 in any case obviously. From a power triangle, it may be seen that when $\phi$=0°, i.e., voltage and current are in-phase in the AC circuit, the active power is equal to the apparent power. In this case, the value of cos $\phi$ is maximum, i.e., cos $\phi$=1. When there is only a purely resistive load in the circuit or inductive reactance is equal to capacitive reactance in the circuit, this situation will occur.

Herein, it is important to note that the detection and measurement apparatus 12 in the above-mentioned embodiment of the disclosure is in wireless connection with the detection apparatus on each load, and the energy control apparatus is in wired connection with the detection and measurement apparatus, wherein the wireless connection at least includes any one of the following forms: GPRS, 3G, WIFI, and Bluetooth.

Specifically, by means of the energy control apparatus 14 as shown in FIG. 2 of the disclosure, it may be implemented that energy provided by the energy supply apparatus 10 is reasonably allocated according to real-time energy data collected by the detection and measurement apparatus 12, and in this process, the detection and measurement apparatus 12 may adopt co-existence management control modes including wireless control and wired control, wherein the energy control apparatus 14 and the detection and measurement apparatus 12 may adopt the wired control. Since the amount of data interacted between the energy control apparatus 14 and the detection and measurement apparatus 12 is larger, transmission lag will be generated by adopting the wireless control, and it may be ensured that data is efficiently interacted in real time by adopting wired transmission. Remote data transmission is performed between the detection apparatus (e.g., electric energy detection meter) of each DC load and the detection and measurement apparatus 12, in order to improve the transmission speed therebetween. Therefore, wireless control may be adopted between the detection apparatus (e.g., electric energy detection meter) of each DC load and the detection and measurement apparatus 12.

It can thus be seen that in a process of collecting, analyzing and comparing the energy usage situation of each load by the entire energy management system via the energy control apparatus 14, main parameters of used electric energy need to be monitored and regulated in real time, so in order to ensure the high efficiency and reliability of power, the system takes a wireless detection control way, a central control room performs unified management and control on the detection and measurement apparatus 12 and the detection and measurement apparatus 12, the energy usage situation of each module may be quickly, efficiently and accurately collected, analyzed and compared, and optimal energy modes are switched as required.

Preferably, in an optional embodiment provided by the embodiment 2 of the disclosure, after the energy data of each load is collected in Step S32, the following steps may also be executed.

Step S321: Fault information is acquired by monitoring the energy data of each load in real time.

Step S323: A faulty load is determined according to the fault information.

Step S325: The faulty load is cut off, and fault alarm information is given.

In the above-mentioned embodiment of the disclosure, a fault loop of the system is monitored on line by monitoring the energy data of each load in real time. Specifically, the collected current voltage data may be compared and analyzed, an abnormal area is locked, and the faulty load is determined by taking conventional fault elimination measures. For example, the abnormal area is cut off within a short time, data is collected and analyzed within this period of time to judge whether the fault is eliminated, if the fault is eliminated, a fault area may be locked, and a maintainer is informed of elimination.

It can thus be seen that the disclosure provides a solution (preferably, wired manner) for quickly cutting a fault point off by monitoring the electric energy parameter situation (voltage, current, reactive power, active power, and power consumption) of each load in real time when a load has an abnormal fault, and the gathered fault data is sent by a communication unit in the energy control apparatus 14 to inform related personnel of maintenance, thereby achieving intelligent management.

Herein, it is important to note that when the fault information of a load is detected, automatic analysis comparison is needed, the load having the fault information is quickly cut off, and after the fault point is cut off, the electric energy data of the load is collected and analyzed to confirm that the fault has been eliminated, thereby ensuring safe, reliable and efficient power of the entire system.

It is important to note that the steps shown in the flowchart of the drawings may be executed in a computer system including a set of computer-executable instructions. Moreover, although a logic sequence is shown in the flowchart, the shown or described steps may be executed in a sequence different from this sequence under certain conditions.

Embodiment 3

Figure 4:
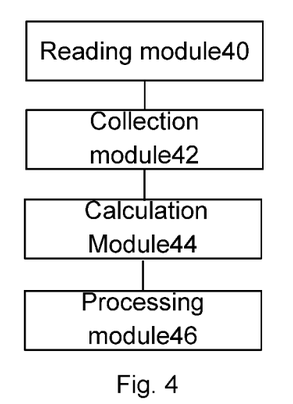
FIG. 4 is a structure diagram of a distributed energy power source control apparatus according to an embodiment 3 of the disclosure.

FIG. 4 is a structure diagram of a distributed energy power source control apparatus according to an embodiment 3 of the disclosure. As shown in FIG. 4, the distributed energy power source control apparatus may include: a reading module 40, a collection module 42, a calculation module 44, and a processing module 46.

Wherein, the reading module 40 is configured to read the total amount of energy provided by an energy supply apparatus for various loads in a system; the collection module 42 is configured to collect energy data of each load, the energy data including: a power supply voltage, a power supply current, a reactive power, an active power, and power consumption; the calculation module 44 is configured to calculate the total power consumption of all the loads in the system; and the processing module 46 is configured to determine an energy allocation policy by comparing the total power consumption and the total amount of energy, the energy allocation policy including: allocating energy according to a priority level of each load, and switching energy modes according to a power factor of each load.

Preferably, the above-mentioned processing module 46 may include: a judgment module, configured to judge whether a ratio of the total power consumption to the total amount of energy is smaller than or equal to a predetermined value; a first sub-processing module, configured to allocate, if the ratio of the total power consumption to the total amount of energy is smaller than or equal to the predetermined value, energy according to the priority of each load selectively; and a second sub-processing module, configured to switch, if the ratio of the total power consumption to the total amount of energy is greater than the predetermined value, energy modes according to a power factor of each load selectively.

Preferably, the above-mentioned first sub-processing module may include: an acquisition module, configured to read the priority of each load; and a first allocation module, configured to allocate energy for a predetermined number of loads in sequence according to a priority order.

Preferably, the above-mentioned second sub-processing module may include: a comparison module, configured to compare the power factor of each load and a corresponding predetermined power factor; and an adjustment module, configured to start, when the power factor of any one or more loads is smaller than or equal to the corresponding predetermined power factor, a power compensation apparatus to adjust a power factor of the system.

Preferably, after the collection module is executed in the above-mentioned embodiment, the apparatus may further execute the following functional modules: a monitoring module, configured to monitor energy data of each load in real time to acquire fault information; a determination module, configured to determine a faulty load according to the fault information; and a fault processing module, configured to cut the faulty load off, and give fault alarm information.

Obviously, those skilled in the art shall understand that all modules or all steps in the disclosure may be implemented using a general calculation apparatus, may be centralized on a single calculation apparatus or may be distributed on a network composed of a plurality of calculation apparatuses. Optionally, they may be implemented using executable program codes of the calculation apparatuses. Thus, they may be stored in a storage apparatus and executed by the calculation apparatuses, the shown or described steps may be executed in a sequence different from this sequence under certain conditions, or they are manufactured into each integrated circuit module respectively, or a plurality of modules or steps therein is manufactured into a single integrated circuit module. Thus, the disclosure is not limited to a combination of any specific hardware and software.

The above is only the preferred embodiments of the disclosure, and not intended to limit the disclosure. There may be various modifications and variations in the disclosure for those skilled in the art. Any modifications, equivalent replacements, improvements and the like within the spirit and principle of the disclosure shall fall within the scope of protection of the disclosure.

What is claimed is:

1. A distributed energy power source control method, comprising:
    reading the total amount of energy provided by an energy supply apparatus for various loads in a system;
    collecting energy data of each load, the energy data comprising: a power supply voltage, a power supply current, a reactive power, an active power, and power consumption;
    calculating the total power consumption of all the loads in the system; and
    determining an energy allocation policy by comparing the total power consumption and the total amount of energy, the energy allocation policy comprising: allocating energy according to a priority level of each load, and switching energy modes according to a power factor of each load;
    wherein the step of determining an energy allocation policy by comparing the total power consumption and the total amount of energy comprises any one or more of the following implementation modes:
        Mode 1: judging whether a ratio of the total power consumption to the total amount of energy is smaller than or equal to a predetermined value, wherein if the ratio of the total power consumption to the total amount of energy is smaller than or equal to the predetermined value, energy is allocated according to the priority of each load selectively, and if the ratio of the total power consumption to the total amount of energy is greater than the predetermined value, energy modes are switched according to a power factor of each load selectively; and
        Mode 2: judging whether the total power consumption is greater than or equal to the total amount of energy, wherein when the total power consumption is greater than or equal to the total amount of energy, energy is allocated according to the priority of each load selectively, and when the total power consumption is smaller than the total amount of energy, energy modes are switched according to a power factor of each load selectively.

2. The method according to claim 1, wherein allocating energy according to the priority of each load comprises:
    reading the priority of each load; and
    allocating energy for a predetermined number of loads in sequence according to a priority order.

3. The method according to claim 1, wherein switching energy modes according to a power factor of each load comprises:
    comparing the power factor of each load and a corresponding predetermined power factor; and
    when the power factor of any one or more loads is smaller than or equal to the corresponding predetermined power factor, starting a power compensation apparatus to adjust a power factor of the system.

4. The method according to claim 1, wherein after the energy data of each load is collected, the method further comprises:
    monitoring the energy data of each load in real time, and acquiring fault information;
    determining a faulty load according to the fault information; and
    cutting the faulty load off, and giving fault alarm information.

5. A distributed energy power source control apparatus, comprising:
    a reading module, configured to read the total amount of energy provided by an energy supply apparatus for various loads in a system;
    a collection module, configured to collect energy data of each load, the energy data comprising: a power supply voltage, a power supply current, a reactive power, an active power, and power consumption;
    a calculation module, configured to calculate the total power consumption of all the loads in the system; and a processing module, configured to determine an energy allocation policy by comparing the total power consumption and the total amount of energy, the energy allocation policy comprising: allocating energy according to a priority level of each load, and switching energy modes according to a power factor of each load;

wherein the processing module comprises:
  a judgment module, configured to judge whether a ratio of the total power consumption to the total amount of energy is smaller than or equal to a predetermined value;
  a first sub-processing module, configured to allocate, if the ratio of the total power consumption to the total amount of energy is smaller than or equal to the predetermined value, energy according to the priority of each load selectively; and
  a second sub-processing module, configured to switch, if the ratio of the total power consumption to the total amount of energy is greater than the predetermined value, energy modes according to a power factor of each load selectively.

6. The apparatus according to claim 5, wherein the first sub-processing module comprises:
  an acquisition module, configured to read the priority of each load; and
  a first allocation module, configured to allocate energy for a predetermined number of loads in sequence according to a priority order.

7. The apparatus according to claim 5, wherein the second sub-processing module comprises:
  a comparison module, configured to compare the power factor of each load and a corresponding predetermined power factor; and
  an adjustment module, configured to start, when the power factor of any one or more loads is smaller than or equal to the corresponding predetermined power factor, a power compensation apparatus to adjust a power factor of the system.

8. The apparatus according to claim 5, wherein after the collection module is executed, the apparatus further comprises:
  a monitoring module, configured to monitor energy data of each load in real time to acquire fault information;
  a determination module, configured to determine a faulty load according to the fault information; and
  a fault processing module, configured to cut the faulty load off, and give fault alarm information.

9. A distributed energy power source control system, comprising:
  an energy supply apparatus, configured to provide energy for each load in the system;
  a detection and measurement apparatus, communicating with a detection apparatus on each load, collecting energy data of each load, detected by the detection apparatus, and calculating the total power consumption of all the loads in the system, wherein the energy data comprises: a power supply voltage, a power supply current, a reactive power, an active power, and power consumption; and
  an energy control apparatus, connected to the detection and measurement apparatus, and configured to determine an energy allocation policy by comparing the total power consumption and the total amount of energy, the energy allocation policy comprising: allocating energy according to a priority level of each load, and switching energy modes according to a power factor of each load;

wherein the energy control apparatus comprises:
  a first processor, configured to judge whether a ratio of the total power consumption to the total amount of energy is smaller than or equal to a predetermined value, wherein if the ratio of the total power consumption to the total amount of energy is smaller than or equal to the predetermined value, energy is allocated according to the priority of each load selectively, and if the ratio of the total power consumption to the total amount of energy is greater than the predetermined value, energy modes are switched according to a power factor of each load selectively; and
  a second processor, configured to judge whether the total power consumption is greater than or equal to the total amount of energy, wherein when the total power consumption is greater than or equal to the total amount of energy, energy is allocated according to the priority of each load selectively, and when the total power consumption is smaller than the total amount of energy, energy modes are switched according to a power factor of each load selectively.

10. The system according to claim 9, wherein the detection and measurement apparatus is in wireless connection with a detection apparatus on each load, and the energy control apparatus is in wired connection with the detection and measurement apparatus, wherein the wireless connection at least comprises any one of the following forms: GPRS, 3G, WIFI, and Bluetooth.

11. The system according to claim 9, wherein the energy supply apparatus comprises any one or more of the following devices:
  a renewable energy device connected to the energy control apparatus, a power grid power supply device, and a storage battery; and
  the system further comprises: a DC power distribution board, connected between the energy control apparatus and each load, and configured to generate an energy allocation instruction of each load according to the energy allocation policy.

* * * * *